United States Patent [19]

Fogelson

[11] Patent Number: 5,454,905
[45] Date of Patent: Oct. 3, 1995

US005454905A

[54] METHOD FOR MANUFACTURING FINE PITCH LEAD FRAME

[75] Inventor: Harry J. Fogelson, San Jose, Calif.

[73] Assignee: National Semiconductor Corporation, Santa Clara, Calif.

[21] Appl. No.: 287,872

[22] Filed: Aug. 9, 1994

[51] Int. Cl.⁶ .................... B44C 1/22; C23F 1/02
[52] U.S. Cl. .................... 156/651.1; 156/654.1; 156/644.1; 437/220
[58] Field of Search .................... 156/634, 644, 156/651, 654, 656, 659.1, 901, 902; 29/827; 437/220; 257/666, 669, 676

[56] References Cited

U.S. PATENT DOCUMENTS

| | | | |
|---|---|---|---|
| 3,553,828 | 1/1971 | Starger | 437/220 |
| 3,795,044 | 3/1974 | Peltz | 437/220 X |
| 4,445,271 | 5/1984 | Grabbe | 437/220 |
| 4,711,700 | 12/1987 | Cusack | 156/651 |
| 4,733,292 | 3/1988 | Jarvis | 156/651 X |

Primary Examiner—William Powell
Attorney, Agent, or Firm—Hickman & Beyer

[57] ABSTRACT

A pitch lead frame and a method for manufacturing the same is disclosed herein. A preferred embodiment of a fine pitch lead frame is generally comprised of a plurality of fine pitch leads, a die pad area, and die pad area support arms. The leads are comprised of a base lead portion formed in an unetched region and a fine pitch lead tip portion formed in an etched region on an electrically conductive material. The base lead portions are substantially the same thickness as the conductive substrate and the lead tip portions are of a smaller thickness. Etching one or more region(s) on an electrically conductive substrate of a substantial uniform thickness to a fraction of the thickness of the unetched regions allows for the formation of fine pitch lead tips in the etched region(s). Some possible methods for forming the leads includes an additional etching, stamping out the leads with a finely tapered stamp tool punch or using conventional stamp tool punches in conjunction with finer stamp tool punches to create the fine pitch lead tips. There is also disclosed examples of various methods for forming the fine pitch lead frame in different configurations.

17 Claims, 8 Drawing Sheets

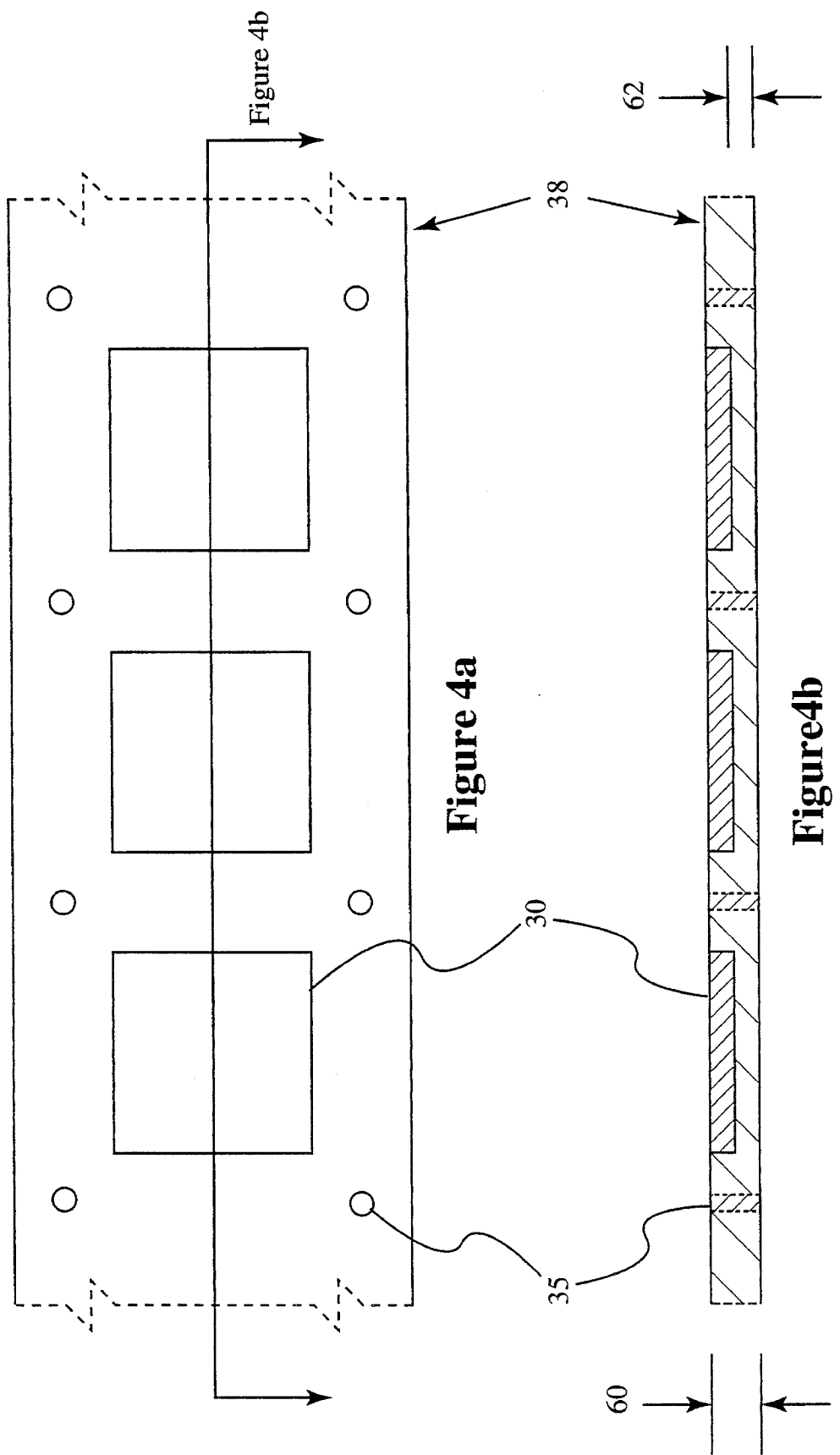

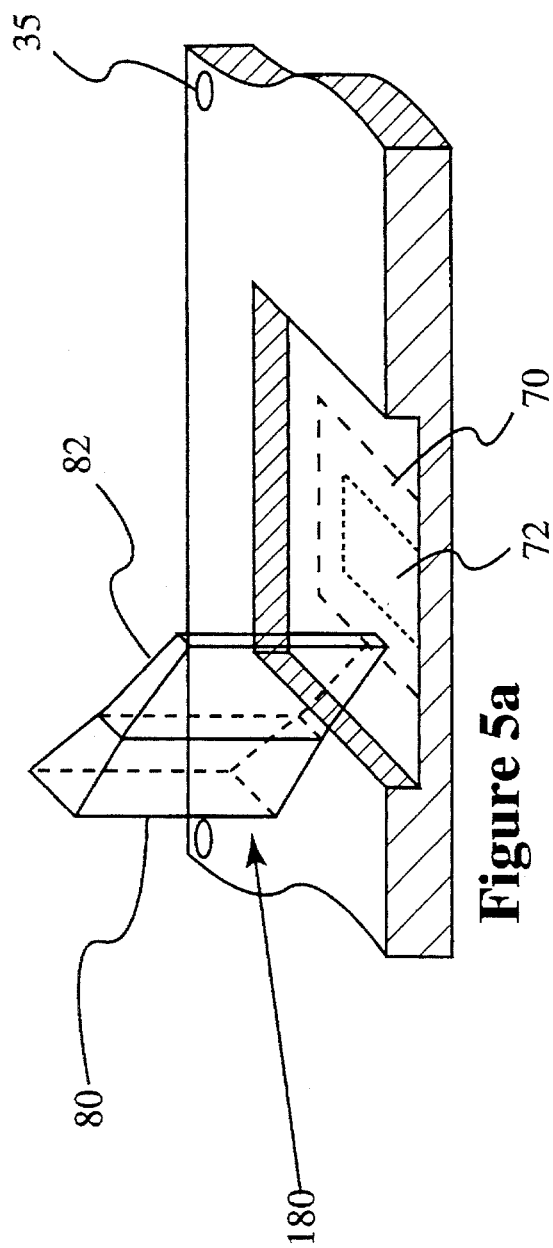
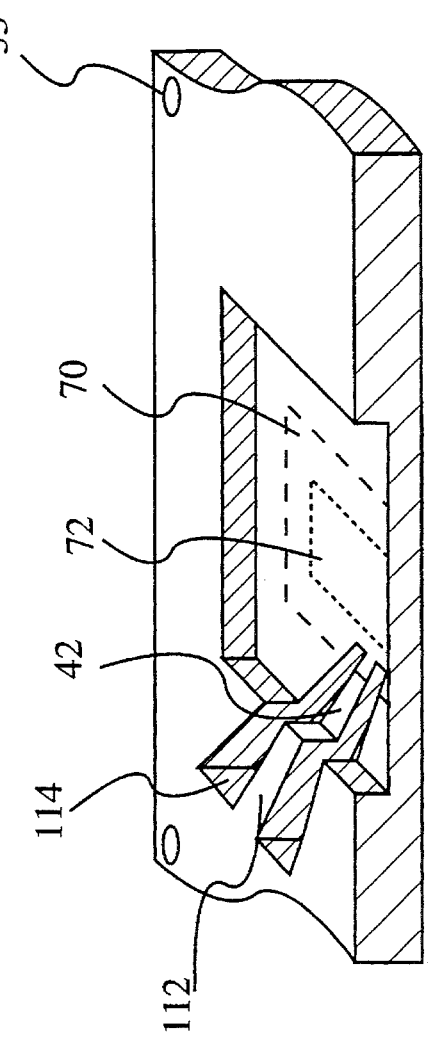
Figure 5a
Figure 5b

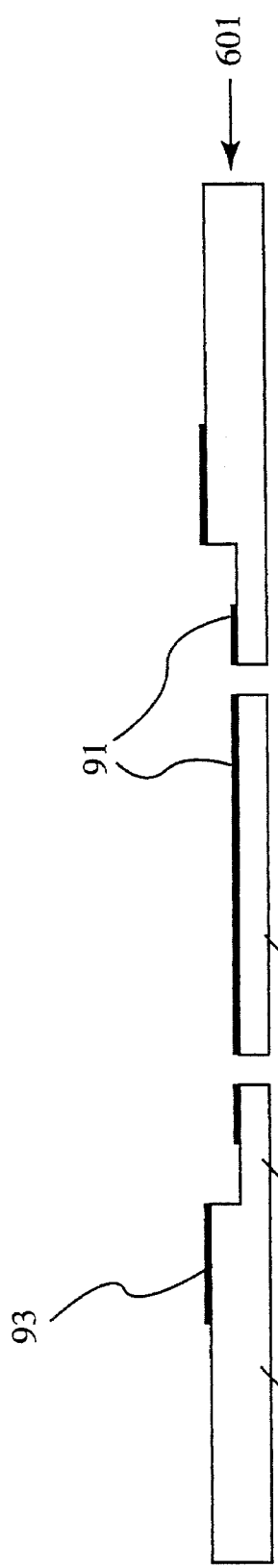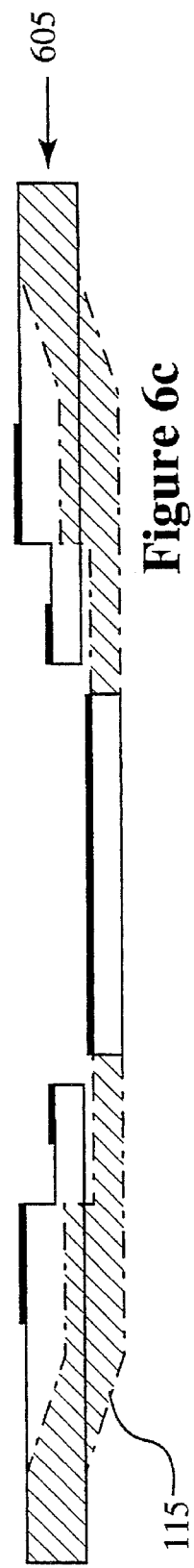

METHOD FOR MANUFACTURING FINE PITCH LEAD FRAME

BACKGROUND OF THE INVENTION

This invention relates generally to lead frames for use in integrated circuit packaging and more particularly, to a fine pitch lead frame where the pitch (i.e., the distance between the centers of adjacent leads) is very small.

Referring to FIG. 1, a lead frame 10 is generally comprised of a die pad area 17, die pad support arms 15 and leads 11. In the manufacture of conventional lead frames the die pad area 17, support arms 15 and leads 11 are formed in one step. The lead forming step may be either an etching process or a stamping process. In these processes the areas between the leads 11 and between the lead tips 12 are removed through respectively stamping or etching. The area between the lead tips are usually referred to as slots 14. In the etching process, a mask of the pattern of leads, die pad area and support arms is laid over a metal strip. The exposed areas are then etched away creating the slots 14 between the leads. The stamping process usually consists of stamping out the slots 14 between the leads, die pad area 17 and support arms 15. Multiple stamp tool punches, shaped in the form of the respective slots 14, punch out the slots 14.

The leads 11 are formed around the die pad area 17. As the leads approach the die pad area they become narrower and narrower and the distance between the leads become smaller. This results in a finer pitch between the centers of the lead tips 12 as the leads get smaller and smaller. The lead tips 12 are formed to have the smallest pitch possible so the maximum number of leads can approach the die pad area 17 and to allow the leads to get as close as possible to the die pad area 17.

The support arms 15 extend out from the die pad area supporting the die pad area during handling. An integrated circuit is placed on the die pad area 17, in the center of the lead The support arms 15 extend out from the die pad area supporting the die pad area during handling. An integrated circuit is placed on the die pad area 17, in the center of the lead frame 10. After the leads 11, die pad area 17 and support arms 15 are formed, the lead frame 10 may be annealed to strengthen and relieve stress on the leads and support arms. This may be followed by plating the lead tips 12 with an electrically conductive material. Plating also allows for better bonding to the bonding wires when the leads are connected to the integrated circuit.

The leads may then be taped with an adhesive strip to keep the leads from moving during handling. The adhesive strip may be a single picture frame style strip that is placed across the leads. An alternative is the application of separate strips placed across a set of leads. The former process allows for better tolerances when the tape either shrinks or expands causing the leads to move. Then, the lead frame 10 may be trimmed to free the lead tips 12 from the die pad area 17.

After trimming, the lead frame is ready to be packaged. An integrated circuit is placed on the die pad area 17 and bonded to the lead tips 12 with bonding wires. The inner portion of the lead frame 20 is then encapsulated with an encapsulating material. The excess metal that supported the entire lead frame 22 is then trimmed away to free the leads 11 from each other. The end product is a packaged semiconductor device.

Semiconductor manufacturers are creating integrated circuits with smaller and smaller die sizes and at the same time increasing the number/of 11in, s they require. For example, integrated circuit manufacturers are developing dies for 208 pin quad flat packages (QFP) that have a bonding pad pitch of 4 mils and requiring a 13 mil space at the corners. Therefore, a die with 208 bonding pads (i.e., 52 bonding pads per side) is approximately 0.234 by 0.234 inches in size. Semiconductor assemblers require a 0.010 inch margin around the die. Therefore, the minimum die pad size is 0.254 inches square for a 208 pin die. As the die sizes of integrated circuits get smaller the lead tips on the lead frames need to get finer and finer in pitch in order to approach the ever shrinking integrated circuit. Current die pads are approximately 0.433 inches square since conventional leads, limited by pitch, cannot approach a smaller die pad. Long bonding wires can connect currently available lead frames with the integrated circuits of a smaller die size. Although, interference and crosstalk occurs in long bonding wires making this method undesirable. This creates pressure on manufacturers of lead frames for integrated circuit packaging to obtain smaller and smaller pitches in their lead frames. A solution to the problem utilizes a finer pitch lead frame.

The limitations of stamping and etching technologies currently constrain the process for making lead frames. Both stamping and etching can only obtain a slot width (the width between adjacent lead tips) of about 4 mils in a 6 mil thick metal strip. This results in a lead tip 4 mils wide and a slot 4 mils wide which gives the lead tips an 8 mil pitch between the centers of two adjacent lead tips. The 8 mil pitch corresponds to the presently obtainable ratio of stamping slot width versus strip thickness of approximately 4:6 in a 6 mil. Therefore, if a thinner metal strip is used, such as a 3 mil strip, a pitch of approximately 5.5 mils is obtainable, which can and has been accomplished with current stamping technologies.

Stamping technology is limited by the ability to punch through a given thickness of metal or other electrically conductive material. A stamp tool punch smaller than the 4:6 ratio is subject to breakage. For example, a stamp tool punch smaller than 3.5 mils thick would not be able to punch through a 6 mil thick metal strip without repeatedly breaking. Etching technology is similarly constrained due to the ability to control the etching process. Due to the diffusion of an etchant during exposure the slots become more irregular through a thicker material. The diffusive nature of etching limits its ability to etch out fine pitch lead frames. As discussed above, the use of thinner material will allow the manufacture of finer pitch lead frames.

Although, a thinner metal strip provides a finer pitch lead frame another constraint is the requirement of using strips of a particular thickness from chip package manufacturers. Presently, 6 mils is the most common standard used in the art. The standard exists due to present manufacturing and molding technologies that rely upon the 6 mil standard as well as the customer's insistence upon the usage of 6 mil thick lead frames. Therefore, in such systems the problem becomes obtaining a finer than 8 mil pitch using a 6 mil thick strip.

One technique for accommodating smaller integrated circuit dies is the method of interposing. Interposing consists of using a conventional lead frame with a conventional pitch and bonding a miniature printed circuit board on top of the lead tips. The printed circuit consists of fine pitch traces from the lead tips to the integrated circuit die which is bonded onto the printed circuit board. While this process leads to smaller pitch lead frames it is prohibitively expensive.

Another technique used is to extend every other lead tip. The extended lead tips are shaped to maintain a 4 mil space between the extended tips and the adjacent unextended tips. The ends of the extended tips end in a rectangular pad large enough for bonding. The extended tips allow the centers of the untapered tips and the centers of the tapered tips to approach closer to each other giving a smaller pitch. This technique is only capable through etching and gives only an incrementally smaller pitch, as for example, approximately 7 mils in 6 mil thick lead frames.

The present invention provides a method for obtaining significantly finer pitches from a given strip, although it is not limited to a specific thickness and can be applied to other thicknesses. The presently disclosed method lends itself especially to the manufacture of lead flames for QFP devices, although not limited to such packages. Further, the invention is not prohibitively expensive and is possible with current technology.

SUMMARY OF THE INVENTION

These and other advantages of the present invention will become apparent to those skilled in the art upon a reading of the following description of a fine pitch lead frame and method for manufacturing the same and a study of the several figures of the drawings. In a preferred embodiment a fine pitch lead frame is generally comprised of fine pitch leads, a die pad area, and die pad support arms. The leads each have a base lead portion formed in an unetched region and a fine pitch lead tip portion formed in an etched region on an electrically conductive material. The base lead portions are substantially the same thickness as the conductive substrate and the lead tip portions are of a smaller thickness. Etching one or more region(s) on an electrically conductive substrate of a substantial uniform thickness to a fraction of the thickness of the unetched regions allows for the formation of fine pitch lead tips in the etched region(s). Some possible methods for forming the leads includes an additional etching, stamping out the leads with a finely tapered stamp tool punch or using conventional stamp tool punches in conjunction with finer stamp tool punches to create the fine pitch lead tips. The combination of an etch and a lead forming step allows for the manufacture of a fine pitch lead frame.

The first step includes the etching of a metal strip to create a region on the metal strip that has been etched to a fraction of the original thickness. The etched region therefore has a smaller thickness than the rest of the strip. The second step forms the leads on the metal strip such that the lead tips are formed in the etched regions and the lead bases are formed in the unetched regions. The lead tips can be of a finer pitch since the thickness of the strip in the etched region(s) is smaller than the thickness in the unetched region.

The lead forming step can be accomplished in several ways. One method utilizes multiple stamp tool punches that have substantially tapered tips. The metal strip is stamped with the tapered punches in such a way that the tapered tips would punch out fine pitch slots in the etched regions. The untapered part of the punches stamps out the slots in the unetched regions. Thus the tapered punches cream the slots in between the base leads and fine pitch lead tips in one stamping.

An alternate approach is to use two sets of stamp tool punches. The first set of punches are ordinary stamp tool punches. These punches stamp out slots in the unetched regions. A second set of fine pitch stamp tool punches then extends the slots in the etched regions, but with a finer pitch.

A third approach is to mask the etched region and do a second etch. Once again because the etched region is of a smaller thickness the second etch can create fine pitch leads. The second mask would be applied to the unetched and etched regions, with the mask in the etched region being of a finer pitch. After exposure the base leads and the fine pitch lead tips in the etched regions will have been formed.

In one embodiment the thickness of the etched region is about half the thickness of the remainder of the strip. In another embodiment a fine pitch lead frame is formed from a 6 mil thick metal strip. Although, the method applies to various thicknesses as well as different types of electrically conductive strips. The first etching step allows for the creation of fine pitch lead frames with smaller pitches than 7.5 mils in current 6 mil thick strips. For example, if half the thickness was etched away the etched region would be about 3 mils thick. A 3 mil thick area would readily allow for a pitch of 5.5 mils or smaller. This can be achieved since thinner stamping tools of a thickness less than 4 mils can be utilized in a thinner etched region. This holds true as well for etching since there is a lesser amount of dispersion through a thinner etched region.

BRIEF DESCRIPTION OF THE DRAWINGS

The present invention may best be understood by reference to the following description taken in conjunction with the accompanying drawings in which:

FIG. 2b is a diagrammatic cross sectional view of the etched metal strip shown in FIG. 2a.

FIG. 3b is an expanded diagrammatic top view of the superimposed lead tip area shown in FIG. 3a.

FIG. 4a is a diagrammatic top view of a metal strip with several etched regions corresponding to several fine pitch lead frames to be manufactured from the metal strip with positioning holes.

FIG. 4b is a diagrammatic cross sectional view of the metal strip 38 showing the etched out regions 30 and positioning holes.

FIG. 5a is a diagrammatic cross sectional view of the etched metal strip being stamped, FIG. 5b is a diagrammatic cross sectional view of the etched metal strip after being stamped, FIGS. 6a–d are diagrammatic cross sectional views of some possible configurations of a fine pitch lead frame.

DETAILED DESCRIPTION OF THE PREFERRED EMBODIMENTS

Figure 1:
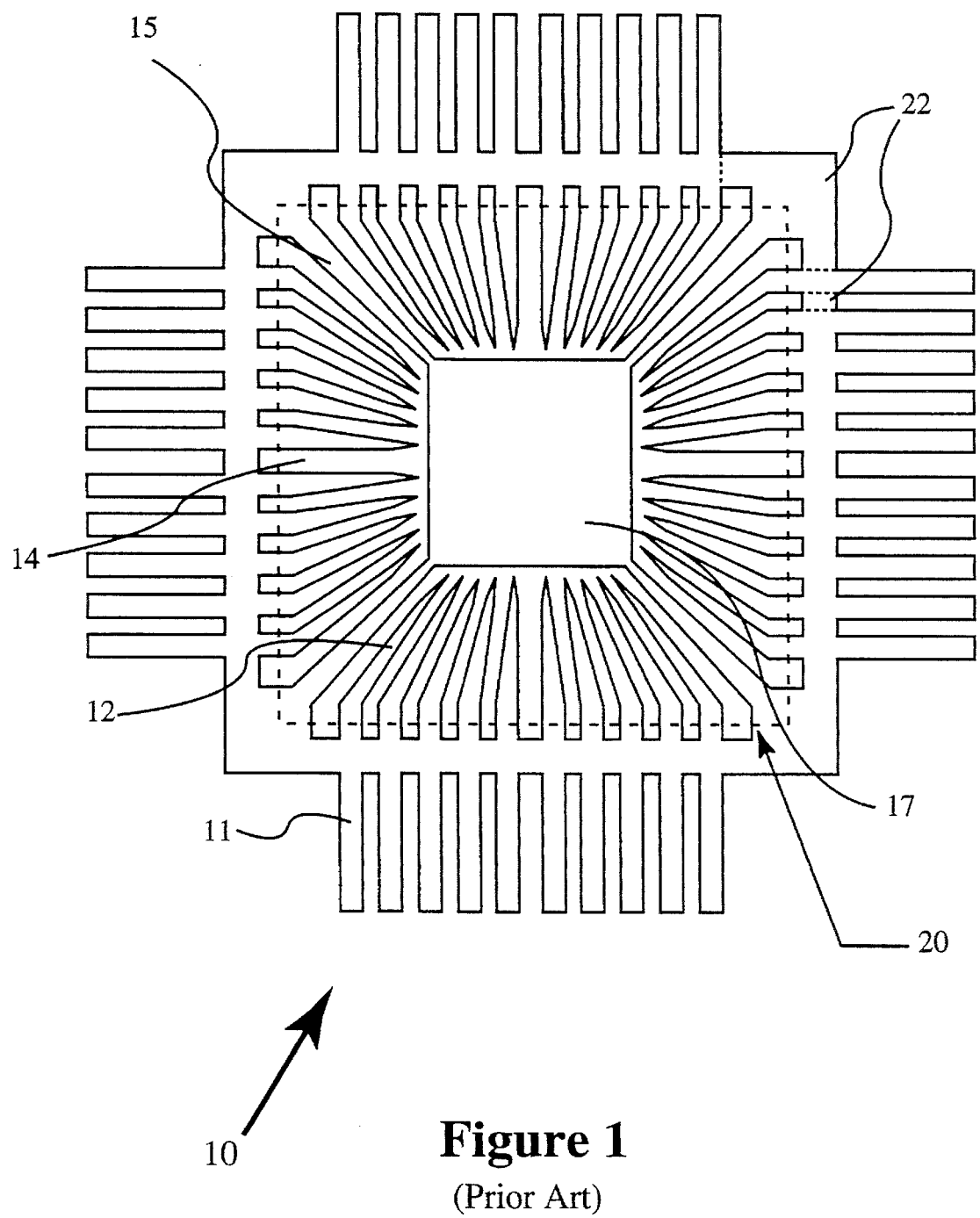
FIG. 1 is a diagrammatic top view of a conventional lead frame of a uniform thickness.
Figure 2C:
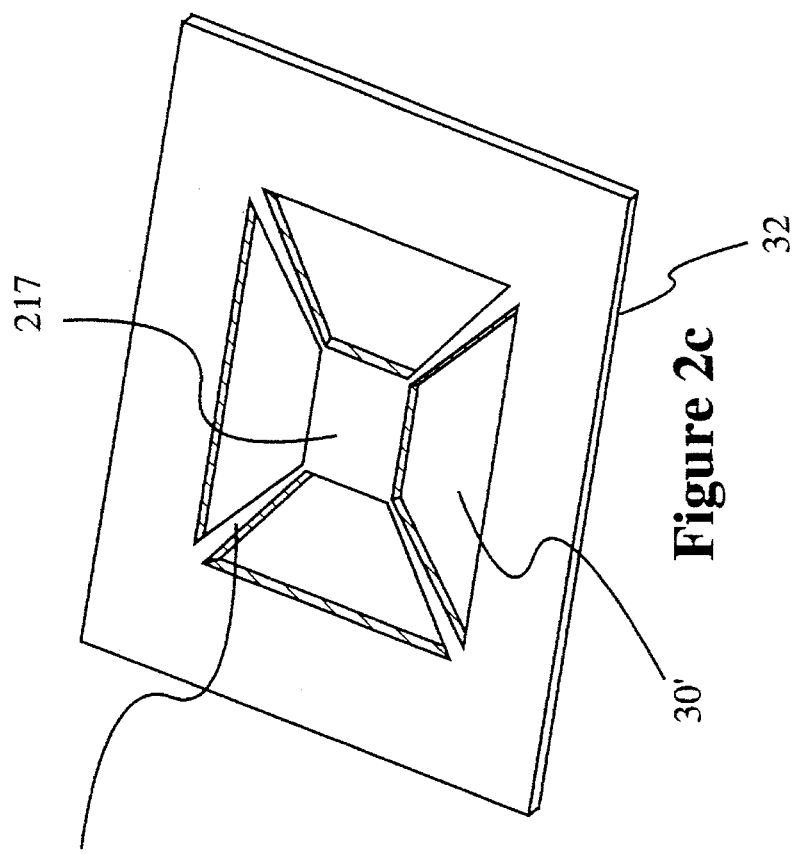
FIG. 2c is a diagrammatic angled top view of a metal strip after the first etching step with a plurality of etched regions surrounding an unetched die pad area in accordance with another embodiment of the present invention.
Figure 2A:
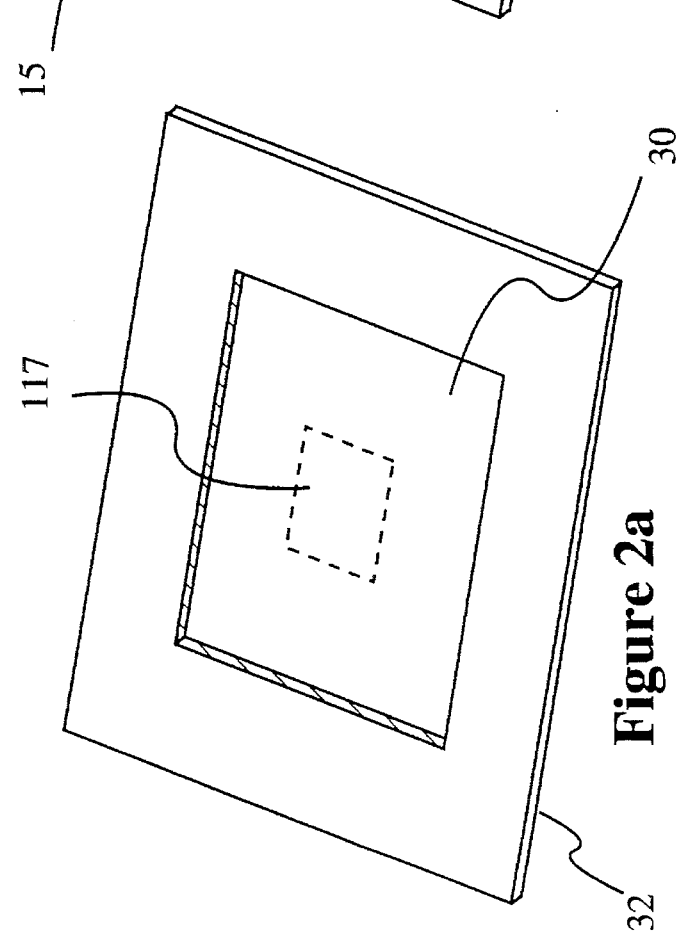
FIG. 2a is a diagrammatic angled top view of a metal strip after the first etching step with the die pad area etched as well in accordance with one embodiment of the present invention.
Figure 2B:
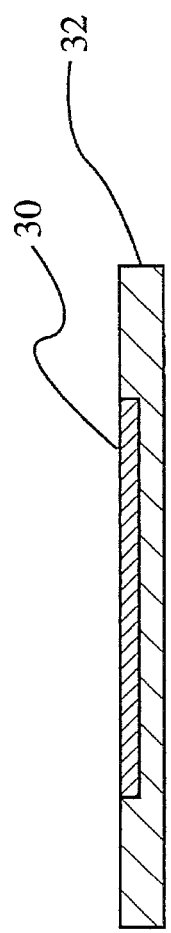

Referring initially to FIGS. 2a, 2b and 2c, one embodiment of the present invention will be described in more detail. A region 30 is etched from an electrically conductive substrate 32. The etched region 30 can be a singular etched region as depicted in FIG. 2a which encompasses an etched die pad area 117. Alternatively, the etched region 30 can be a plurality of etched regions 30' surrounding an unetched die pad area 217 and bordered by unetched die pad area support arms 15 as illustrated in FIG. 2c.

Generally, a lead frame includes a die pad area, die pad area support arms, and leads although in some embodiments the die pad area and/or the die pad support arms may be eliminated. In an embodiment of the present invention of a fine pitch lead frame the leads include a thicker base portion 112 and a thinner lead tip portion 42. By way of example, when a 6 mil thick metal strip is used pitches less than 7.5 mils, which today is generally considered about the minimum attainable pitch using mass production technologies, can be obtained. Pitches of less than 6 mils are readily achievable as evidenced by such pitches when conventionally processing a uniform 3 rail thick metal strip. Further, pitches of less than 5 mil can be obtained in a 6 mil thick material as necessary for various pin counts and package types. Of course, the thickness of the metal strips used in the process may be widely varied in accordance with the needs of a particular system.

Figure 3A:
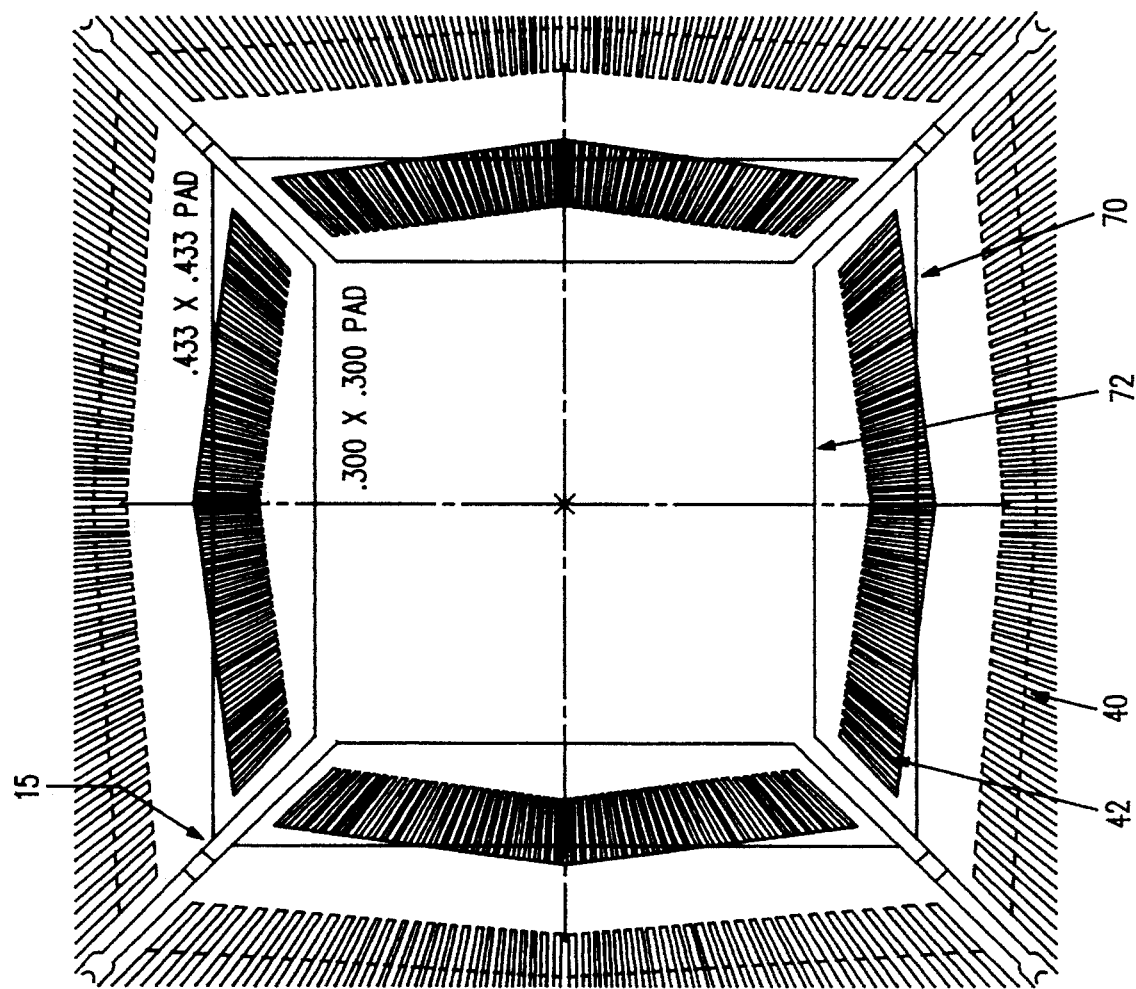
FIG. 3a is a diagrammatic top view illustration of a lead tip area of a conventional 208 pin lead frame with the lead tip area of a fine pitch 208 pin lead frame formed in accordance with the present invention superimposed thereon to illustrate the improvement that can be realized using the present invention.
Figure 3B:
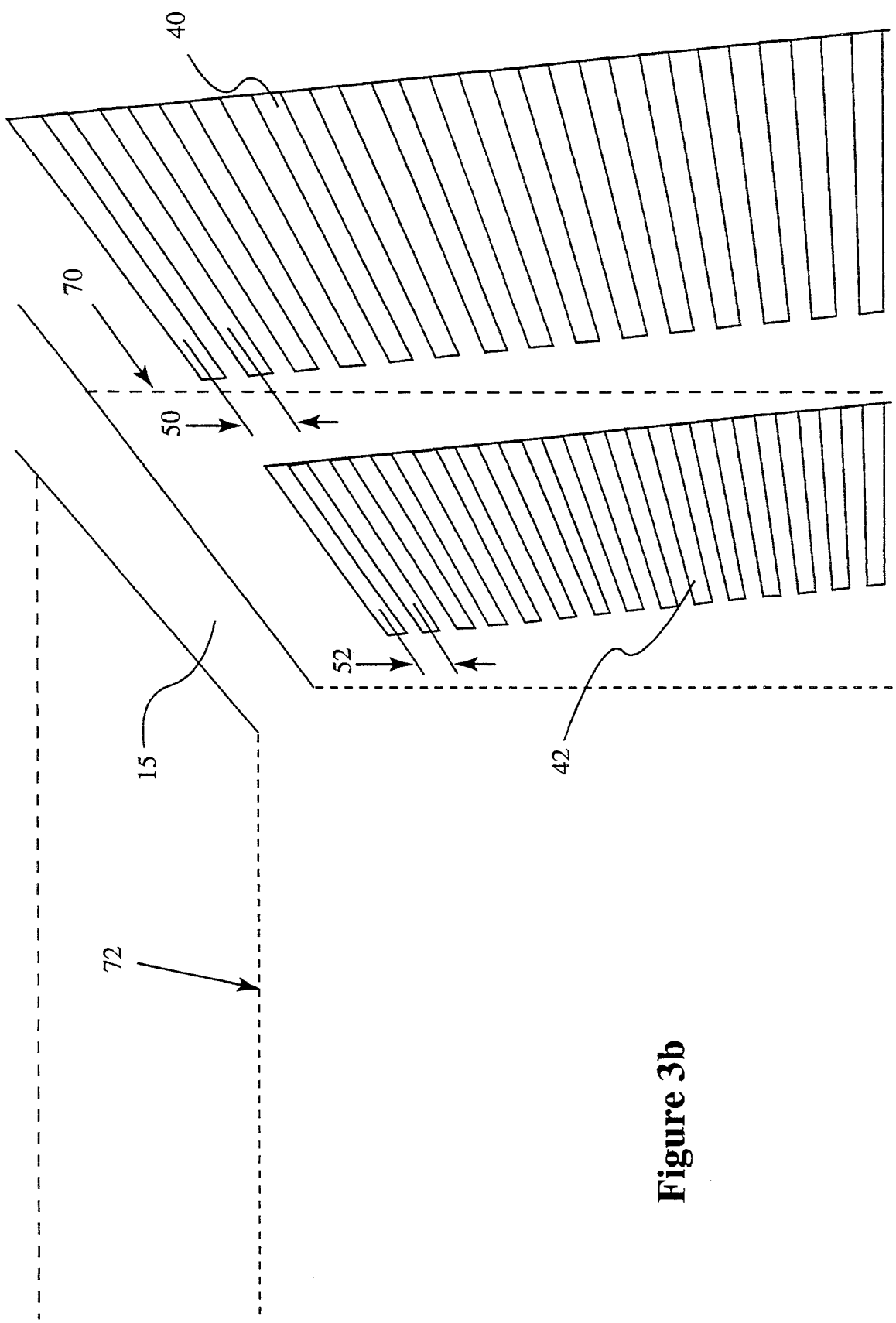

One of the advantages of the present invention is illustrated with reference to FIGS. 3a and 3b specifically the creation of an etched region 30 allows for the creation of fine pitch lead tips 42 that can approach a smaller die pad area 72. Conventional lead tips 40 can only approach conventionally sized die pad areas 70. FIG. 3a depicts the die pad area 70 of a conventional 208 pin lead frame approximately 0.433 by 0.433 inches in size and the surrounding lead tips 40. Superimposed therein is a smaller die pad area 72 that can be utilized in a 208 pin fine pitch lead frame of approximately 0.300 by 0.300 inches. A smaller die can be used since finer lead tips 42 can approach a smaller die pad area 72. As shown in FIG. 3b the fine pitch lead tips 42 have a smaller pitch 52 than the conventional pitch 50 of the conventional lead tips 40.

In another embodiment the etched region 30 can be repeated on a metal strip 38 such that a number of fine pitch lead frames can be made from a single metal strip 38 as shown in FIGS. 4a and 4b. Creating a number of fine pitch lead frames on a single metal strip increases the efficiency of the manufacturing process. In order to align the strip through the etching and the later lead forming processes location holes 35 can be formed on the metal strip 38. The location holes may be created during the etching of the etched region 30 or 30' or in a prior or subsequent stamping process.

Once the etched region is formed the fine pitch lead tips 42 and the thicker base leads can be formed. As shown in FIGS. 5a and 5b the fine pitch lead tips 42 and the thicker base leads 112 can be made by utilizing tapered fine pitch stamp tool punches 180. In one embodiment each of the fine pitch stamp tool punches 180 is a singular piece. Each punch 180 is used to punch out a corresponding fine pitch slot 114. The punch 180 is positioned such that the finely tapered portion of the punch 82 punches out the part of the slot 114 in the etched region 30 and the base portion of the punch 80 punches out the part of the slot 114 in the unetched region. As can be seen in FIG. 5b the results are a base lead portion 112 in the unetched regions and fine pitch lead tip 42 created between the slots 114 extending within a conventional die pad area 70 and approaching a smaller die pad area 72.

In another embodiment each stamp tool punch 180' can be formed from a pair of stamp tool punches. That is, a fine pitch tapered stamp tool punch 82' and a base stamp tool punch 80'. The two punches 80' and 82' acting together serve the same function as a single piece stamp tool punch 180 described earlier. The fine pitch stamp tool punch 82' punches out an area in the etched region and the base stamp tool punch 80' punches out an area in the unetched region. The punched out areas intersect such that they form a fine pitch slot 114 in both the etched and unetched regions. The two punch process also results in the creation of base lead portions 112 in the unetched region and fine pitch lead tips 42 in the etched region 30 approaching a smaller die pad area 72. Using multiple punches 180 or 180' a fine pitch lead frame can be formed from an etched metal strip 38.

A second etching may also be employed to create the fine pitch lead tips 42. By placing a mask in the shape of a fine pitch lead frame over the etched metal strip 38 and etching away the slots 114. Fine pitch lead tips 42 can thus be created in the same form as the earlier embodiments. As with stamping the second etching can achieve a finer pitch than conventional lead frames due to the smaller thickness of the etched area.

After the lead forming step the lead frame can be configured in any suitable manner, a few of which are depicted in FIGS. 6a–6d in a cross sectional view. Plating, annealing and taping the fine pitch lead frames are some possible additional steps in manufacturing a fine pitch lead frame. Plating the fine pitch lead tips 42 and the die pad area 117 or 217 with a metallic coating facilitates bonding the fine pitch lead tips 42 and the integrated circuit with bonding wires. Taping the leads across the base lead portions 112 provides support to the leads during shipping and handling. FIGS. 6a–6c illustrate some possible configurations where the etched region 30 is a singular etched region including an etched die pad area 117 the lead frame can be configured in many ways. FIG. 6a displays a cavity up lead frame with the etched region 30 face up and the plating 91 placed within the etched region 30. Tape 93 is placed on the top surface of the unetched region. FIG. 6b alternatively shows a cavity down lead frame after the lead forming step with the etched region 30 faced down and the plating 91 and tape 93 placed on the unetched side of the lead frame. The etched die pad area 117 can be downset, as shown in FIG. 6c, to place the die pad area 117 below the plane of the lead frame to facilitate bonding. The etched die pad support arms 115 are bent to lower the die pad area 117. FIG. 6d relates to a lead frame where the die pad area is unetched 217. The plating 91 and the tape 93 are placed on the unetched side of the lead frame. The unetched die pad area 217 is supported by unetched die pad support arms (not shown). This configuration can be down set as well, similar to the configuration shown in FIG. 6c.

The configurations shown in FIGS. 6a, b and d can also be manufactured without die pad area support arms. By taping the entire fine pitch lead frame after the leads have been formed, the die pad area 117 or 217 can be kept in place while applying the plating 91 and tape 93.

Figure 7:
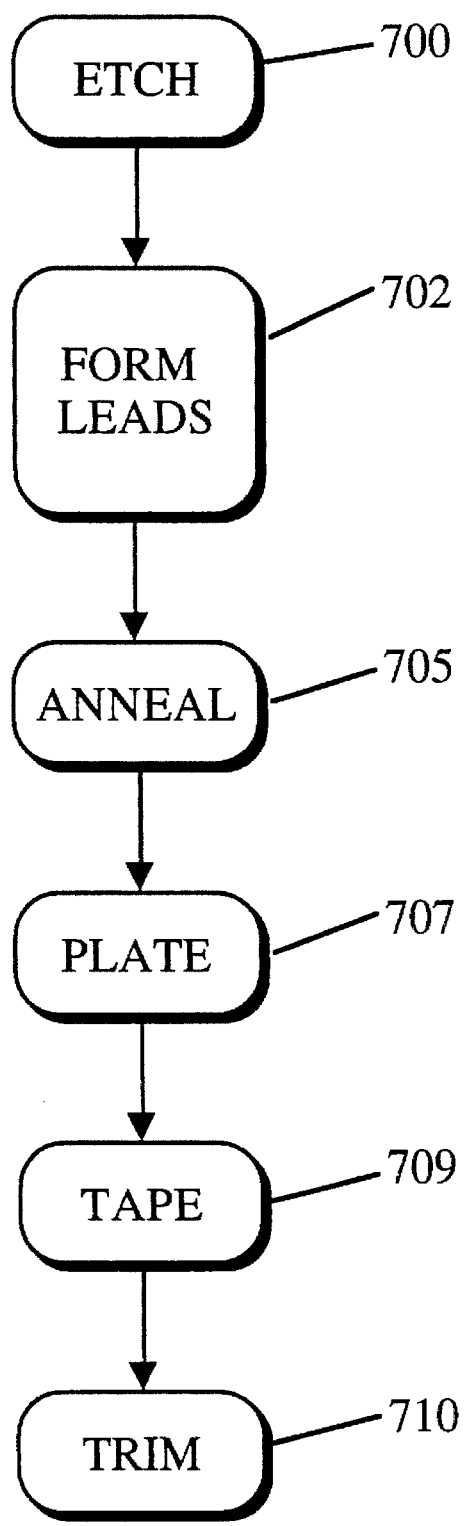
FIG. 7 is a diagrammatic flow chart of a method of producing a fine pitch lead frame.

A method of forming a fine pitch lead frame in accordance with one embodiment of the present invention is generally outlined in FIG. 7. An etching step 700 etches out a region 30 or regions 30' where fine pitch lead tips 42 are to be formed. A lead forming step 702 can be accomplished by stamping or etching out the slots 114 between the fine pitch lead tips 42 and base leads 112. Stamping can be accomplished by a single stamp tool punch 180 with a fine pitch tapered tip 82 and a base stamp tool portion 80. In another embodiment a set of stamp tool punches comprised of a fine pitch tapered stamp tool punch 82' and a base stamp tool punch 80'. The lead forming step 702 is then followed by an annealing step 705 to strengthen and relieve stress throughout the lead frame. A plating step 707 then applies plating 91 on the die pad area 117 or 217 and the ends of the fine pitch lead tips 42 to facilitate bonding. Tape 93 is then applied in the taping step 709 across the base leads 112 to support the lead frame during shipping and handling. Finally, the fine pitch lead tips 42 are trimmed so that there is no contact between the lead tips 42 and the die pad support area 117 or 217. The trimming step 710 also removes other unneeded portions of the lead frame which may have provided support to the lead frame structure during processing. The steps in the above described embodiment can be varied as to chronology. In producing a fine pitch lead frame with a down set, a down setting step can be included in the described embodiment. Additionally, some of the steps, other than an etching 700 and a lead forming step 702 may be omitted.

The present application has discussed methods for manufacturing fine pitch lead flames utilizing a single level etch in the etching step 700. Although, the invention is not limited to a single level etch. Multiple etches can be utilized to obtain a tiered etched region that can provide finely pitched lead tips while also providing better strength. With the refinement of etching technologies a gradually sloping etched region, resembling the inside of a shallow bowl, may be achieved to create a more uniform lead thickness transition in a fine pitch lead frame. Also, the etching need not only be applied to one side of an electrically conductive substrate. Etching a smaller thickness on both sides of an electrically conductive strip rather than etching only one side with a greater thickness is possible while obtaining the same results.

Although, several embodiments of the present invention have been described in detail, it should be understood that the present invention may be embodied in many other specific forms without departing from the spirit or scope of the invention. Particularly, the lead forming step can be performed by other methods other than by etching or stamping. Also, future developments such as laser etching or improved techniques in lead forming technology can be readily incorporated in the advantages of the present invention. The metal strip can be any type of electrically conductive material not necessarily a metallic element. The present invention applies to all types of semiconductor device packages such as, but not limited to, dual in line pin, lead chip carrier, quad flat pack and pin grid array packages utilizing a variety of encapsulating materials ranging from plastic and ceramic to metal. Therefore, the present examples are to be considered as illustrative and not restrictive, and the invention is not to be limited to the details given herein, but may be modified within the scope of appended claims.

I claim:

1. A method for producing fine pitch lead flames from a metal strip having a substantially uniform thickness, the method comprising the steps of:

etching a first region of a metal strip to form a first etched region that has a thickness that is less than the uniform thickness of the metal strip; and forming a multiplicity of leads, each lead having a lead tip portion formed in the first etched region and a lead base portion formed outside of the first etched region, the lead tips being arranged in a pattern that surrounds a die pad area which is formed from a portion of the metal strip and which is sized suitably for receiving an integrated circuit die.

2. A method as recited in claim 1 wherein the die pad area is formed from a portion of the metal strip located outside of said first etched region so that the die pad region has a thickness that is greater than the thickness of the lead tips.

3. A method as recited in claim 1 wherein the integrated circuit die pad area is formed from said first etched region.

4. A method as recited in claim 1 wherein the lead forming step includes etching of the metal strip to form the leads using a second etch independent of the first etch.

5. A method as recited in claim 1 wherein the lead forming step includes stamping cuts into the metal strip to form said leads, the lead forming stamping being accomplished by a plurality of stamp tool punches.

6. A method as recited in claim 5 wherein a first plurality of stamp tool punches are used to stamp lead defining cuts in the regions outside of the first etched region and a second plurality of stamp tool punches are used to stamp lead defining cuts within the first etched region, whereby the first plurality of stamp tool punches are used to make cuts in thicker portions of the metal strip and the second plurality of stamp tool punches are used to make cuts in thinner portions of the metal strip so that fine pitch lead tips may be formed.

7. A method according to claim 5 wherein the a plurality of stamp tool punches are substantially tapered such that narrower portions of the stamp tool punches are used to make stamping cuts in the first etched region and wider portions of the stamp tool punches are used to make stamping cuts in thicker regions outside of the first etched region.

8. A method as recited in claim 1, the first etching step includes:

etching a plurality of location holes on the metal strip to provide proper alignment of the metal strip between the first etching and lead forming steps.

9. A method as recited in claim 5, the first etching step includes etching of a plurality of ovular location holes on a lengthwise edge of the metal strip; and the stamping step includes stamping a plurality of circular holes on the other lengthwise edge such that the ovular holes provides tolerance for adjustment of the metal strip between the first etching and lead forming steps and the circular holes provides accuracy during the stamping step.

10. A method as recited in claim 1 wherein a plurality of fine pitch lead frames are formed on the metal strip.

11. A method as recited in claim 1 wherein each lead tip has a lead tip center, the uniform thickness of the metal frame is approximately 6 mils and a distance between lead tip centers of adjacent lead tips in less than approximately 8 mils.

12. A method as recited in claim 11 wherein the thickness of the first etched region is in the range of 2–4 mils.

13. A method as recited in claim 1 wherein the first etched region is comprised of a plurality of etched regions such that the plurality of etched regions is less than the uniform thickness of the metal strip such that the plurality of etched regions are arranged in a pattern that surrounds a die pad area of a greater thickness.

14. A method as recited in claim 1 wherein the first etching step includes:

(a) etching a first region that has a thickness that is less than the uniform thickness of the metal strip;

(b) etching a subsequent region within the previously etched region that has a thickness that is less than the uniform thickness of the previous region;

(c) repeating step (b) until a tiered etched region with varying thicknesses less than the uniform thickness of the metal strip, such that a most interior region of the tiered etched region has the smallest thickness.

15. A method as recited in claim 1, the method further comprising the steps of:

annealing the fine pitch lead frame wherein the fine pitch lead frame is heated to strengthen and relieve stresses on said fine pitch lead frame;

plating the fine pitch lead tips of the plurality of leads with a conductive coating to provide a better bonding surface;

taping the plurality of leads wherein an adhesive strip is applied across the plurality of leads such that the plurality of leads are prevented from moving while the metal strip is being handled; and trimming wherein the multiplicity of leads are trimmed such that the leads do not contact the integrated circuit die pad area.

16. A method as recited in claim 15, the method further comprising the step of:

downsetting the fine pitch lead frame wherein the integrated circuit die pad area is depressed below the plane of the metal strip.

17. A method as recited in claim 1 wherein each lead tip has a lead tip center, the uniform thickness of the metal frame is less than 6 mils and a distance between lead tip centers of adjacent lead tips in less than approximately 8 mils.

* * * * *

UNITED STATES PATENT AND TRADEMARK OFFICE
CERTIFICATE OF CORRECTION

PATENT NO. : 5,454,905
DATED : October 3, 1995
INVENTOR(S) : Fogelson

It is certified that error appears in the above-indentified patent and that said Letters Patent is hereby corrected as shown below:

```
Claim 1, line 59, in column 7, change "flames" to --frames--
Column 1, delete lines 36-39
Column 2, line 2, change "number/of llin, s" to --number of
pins--
Column 3, line 15, change "flames" to --frames--
Column 3, line 61, change "cream" to --create--
Column 5, line 23, change "rail" to --mil--
Column 7, line 23, change "flames" to --frames--
```

Signed and Sealed this

Twentieth Day of August, 1996

Attest:

BRUCE LEHMAN

*Attesting Officer*   *Commissioner of Patents and Trademarks*